(12) United States Patent
Haddad

(10) Patent No.: US 8,903,015 B2
(45) Date of Patent: Dec. 2, 2014

(54) APPARATUS AND METHOD FOR DIGITAL PREDISTORTION OF NON-LINEAR AMPLIFIERS

(75) Inventor: Khalil Haddad, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 307 days.

(21) Appl. No.: 13/301,479

(22) Filed: Nov. 21, 2011

(65) Prior Publication Data

US 2012/0128098 A1    May 24, 2012

Related U.S. Application Data

(60) Provisional application No. 61/416,189, filed on Nov. 22, 2010.

(51) Int. Cl.
*H04L 25/49* (2006.01)
*H03F 1/32* (2006.01)

(52) U.S. Cl.
CPC ...... *H03F 1/3294* (2013.01); *H03F 2201/3233* (2013.01); *H03F 2201/3224* (2013.01); *H03F 1/3247* (2013.01)
USPC .......................................................... 375/297

(58) Field of Classification Search
CPC .............. H01B 1/04; H01B 1/10; H03D 1/04; H03D 1/06; H03K 5/01; H03K 6/04; H04L 25/03; H04L 25/49; H04L 27/36
USPC ......... 375/232, 254, 278, 284, 285, 295, 296, 375/297, 346, 355; 455/63, 67.13, 114.1, 455/114.2, 114.3, 126
See application file for complete search history.

(56) References Cited

U.S. PATENT DOCUMENTS

| | | | |
|---|---|---|---|
| 6,785,351 B1 * | 8/2004 | Qiu ............................... | 375/346 |
| 7,724,840 B2 * | 5/2010 | McCallister et al. ......... | 375/297 |
| 2004/0179629 A1 * | 9/2004 | Song et al. ................... | 375/296 |
| 2009/0054016 A1 * | 2/2009 | Waheed et al. ............. | 455/114.3 |

OTHER PUBLICATIONS

H. Paaso "Comparison of Direct Learning and Indirect Learning Predistortion Architectures" 2008.*
D. Zhou "Novel Adaptive Nonlinear Predistorters Based on the Direct Learning Algorithm" Jan. 1, 2007.*

* cited by examiner

*Primary Examiner* — Sam K Ahn
*Assistant Examiner* — Shawkat M Ali

(57) ABSTRACT

A method used in a transmitting device comprising a non-linear amplifier and a digital predistortion (DPD) circuit. The method updates real and imaginary look-up tables used by the DPD. The method comprises: i) time-aligning a complex input signal, A, and a complex output signal, E. Signal A is a scan from 0 to a maximum value comprising N discrete points and signal E also comprises N discrete points. The method comprises: ii) performing an array division of $A/E=(Y_r, Y_i)$, where $Y_r$ and $Y_i$ are the real and imaginary components, respectively; and iii) computing a real curve and an imaginary curve using curve-fitting algorithms that best fit the data with coordinates $(|A|, Y_r)$ and $(|A|, Y_i)$. The method stores the real curve in a real lookup table (LUT) and the imaginary curve in an imaginary lookup table (LUT). The method iteratively updates the real LUT and the imaginary LUT.

16 Claims, 7 Drawing Sheets

APPARATUS AND METHOD FOR DIGITAL PREDISTORTION OF NON-LINEAR AMPLIFIERS

CROSS-REFERENCE TO RELATED APPLICATION(S) AND CLAIM OF PRIORITY

The present application is related to U.S. Provisional Patent Application No. 61/416,189, filed Nov. 22, 2010, entitled "ALGORITHMS FOR DIGITAL PREDISTORTION OF NONLINEAR AMPLIFIERS". Provisional Patent Application No. 61/416,189 is assigned to the assignee of the present application and is hereby incorporated by reference into the present application as if fully set forth herein. The present application hereby claims priority under 35 U.S.C. §119(e) to U.S. Provisional Patent Application No. 61/416, 189.

TECHNICAL FIELD OF THE INVENTION

The present application relates generally to power amplifiers and, more specifically, to digital predistortion techniques for use with power amplifiers.

BACKGROUND OF THE INVENTION

Radio frequency (RF) transmitters typically include a power amplifier (PA). The power amplifier may be operated in its non-linear region near saturation in order to increase the power efficiency. Due to the non-linearity of the power amplifier, the adjacent channel leakage ratio (ACLR) level becomes unacceptable, because the output spectrum expands and causes interference with adjacent transmission channels. To fix this problem, an amplifier linearization technique is performed by employing an adaptive digital pre-distorter (DPD). The digital pre-distorter linearizes the power amplifier by generating a nonlinear transfer function that is the inverse to the power amplifier in such a way, that when the digital pre-distorter precedes the power amplifier, the overall system—digital pre-distorter plus the power amplifier—is close to being linear.

To compute and constantly update the parameters of the digital pre-distorter, a digital signal processor (DSP) may capture two signals: i) the transmitted (reference) signal and ii) the power amplifier output (i.e., feedback). A digital pre-distorter typically comprises a combination of blocks configured in series: memory-less nonlinearity, linear and non-linear filters. The digital pre-distorter is usually implemented in an application-specific integrated circuit (ASIC) or field programmable gate array (FPGA).

Most available adaptive predistorters for power amplifiers with memory effects are based on an indirect learning method, such as the learning method disclosed in C. Eun and E. Powers, "A New Volterra Predistorter Based On The Indirect Learning Architecture," IEEE Transactions On Signal Processing", Vol. 45, No. 1, January 1997, which is hereby incorporated by reference into the present disclosure as if fully set forth herein. FIG. 2 illustrates an exemplary configuration for implementing an indirect learning method. The method is called the indirect learning method because the post-inverse filter coefficients are first identified and are then copied to work as a predistorter. This is very popular since the computational complexity is lower than other methods.

Two drawbacks may affect the performance of the indirect learning model. First, the measurement of the output of a power amplifier may be noisy. Thus, the adaptive algorithm converges to biased values, as discussed in D. Zhou and V. DeBrunner, "Novel Adaptive Nonlinear Predistorters Based On The Direct Learning Algorithm," IEEE Transactions On Signal Processing", Vol. 55, No. 1, January 2007, which is hereby incorporated by reference into the present disclosure as if fully set forth herein.

Second, the nonlinear filters cannot be commuted. That is, the identified adaptive inverse model is actually a post-inverse model. Thus, placing a copy of this model in front of the nonlinear device does not guarantee a good pre-inverse model for the nonlinear device. These drawbacks are not in the direct learning architecture.

Therefore, there is a need in the art for an improved pre-distortion method and apparatus for use with a power amplifier of a transmitter.

SUMMARY OF THE INVENTION

A method is provided for use in a transmitting device comprising a non-linear amplifier and a digital predistortion circuit. The method updates a real look-up table and an imaginary lookup table used by the digital predistortion circuit. The method comprises: i) time-aligning a complex input signal, A, to the non-linear amplifier and a complex output signal, E, from the non-linear amplifier. The input signal, A is a scan from 0 to a maximum acceptable dynamic range comprising N discrete points and the output signal, E, also comprises N discrete points. The method also comprises: ii) performing an array division of the complex input signal, A, and the complex output signal, such that $A/E=(Y_r, Y_i)$, where $Y_r$ and $Y_i$ are the real and imaginary components, respectively; and iii) computing a real curve and an imaginary curve using curve-fitting algorithms that best fit the data with coordinates $(|A|, Y_r)$ and $(|A|, Y_i)$. The method further comprises storing the real curve in a real lookup table and storing the imaginary curve in an imaginary lookup table. The method iteratively updates the real lookup table and iteratively updates the imaginary lookup table.

Another method is provided for use in a transmitting device comprising a non-linear amplifier and a digital predistortion (DPD) circuit. The method updates a real look-up table (LUT) and an imaginary lookup table (LUT) used by the DPD circuit. The method comprises: i) time-aligning a complex input signal, A, to the amplifier and a complex output signal, E, from the non-linear amplifier. The input signal, A, is a scan from 0 to a maximum acceptable dynamic range comprising N discrete points and the output signal, E, also comprises N discrete points. The method also comprises: ii) performing an array division of the complex input signal, A, and the complex output signal, such that $A/E=(Y_r, Y_i)$, where $Y_r$ and $Y_i$ are the real and imaginary components, respectively; and iii) computing a real curve and an imaginary curve using a curve-fitting algorithm that best fits the data with coordinates $(|A|, Y_r)$ and $(|A|, Y_i)$. The method further comprises storing the real curve in a real LUT and storing the imaginary curve in an imaginary LUT. The method iteratively updates the real LUT and the imaginary LUT. The method also comprises combining the real and imaginary LUTs from iteration (n) with the real and imaginary LUTs from iteration (n−1) to generate a real LUT and an imaginary LUT for iteration (n+1).

A further method is provided for use in a transmitting device comprising a non-linear amplifier, a digital predistortion (DPD) circuit comprising a non-linear filter (NF) block, and a residual error model (REM) block associated with the non-linear amplifier and the DPD circuit and configured in a direct learning architecture. The method updates parameters of the NF block. The method comprises: i) at iteration (n), computing the parameters of the REM block; and ii) at iteration (n), computing the parameters of the inverse REM block. The method also comprises: iii) combining the parameters of the inverse REM block computed at iteration (n) with the parameters of the NF block computed at iteration (n−1) to produce new parameters of the NF block; and iv) replacing the parameters of the NF block at iteration (n−1) with the new parameters of the NF block.

Still another method is provided for use in a transmitting device comprising a non-linear amplifier, a digital predistortion (DPD) circuit comprising a non-linear filter (NF) block, and a residual error model (REM) block associated with the non-linear amplifier and the DPD circuit and configured in an indirect learning architecture. The method updates parameters of the NF block. The method comprises: i) at iteration (n), computing the parameters of the REM block; ii) combining the parameters of the REM block computed at iteration (n) with the parameters of the NF block computed at iteration (n−1) to produce new parameters of the NF block; and iii) replacing the parameters of the NF block at iteration (n−1) with the new parameters of the NF block.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged power amplifier using digital predistortion.

Generally, digital predistortion (DPD) apparatuses and methods according to the principles of this disclosure may be implemented in any type of non-linear amplifier in a transmission device. In exemplary embodiments, the digital predistortion (DPD) apparatuses and methods disclosed herein may advantageously be implemented in the base stations or mobile stations, or both, of a wireless network, such as a cellular network.

The present application discloses algorithms for computing components in different types of DPD blocks, including memoryless (Cartesian) and non linear filters) blocks, in order to linearize the amplifier. These algorithms are iterative and are designed for different popular DPD architectures. These algorithms are mainly based on modeling the residual error (RE) at iteration (n), then combining the RE at (n) with the previous solution of the DPD of iteration (n−1) until convergence occurs (i.e., reaching a satisfying performance).

Figure 1:
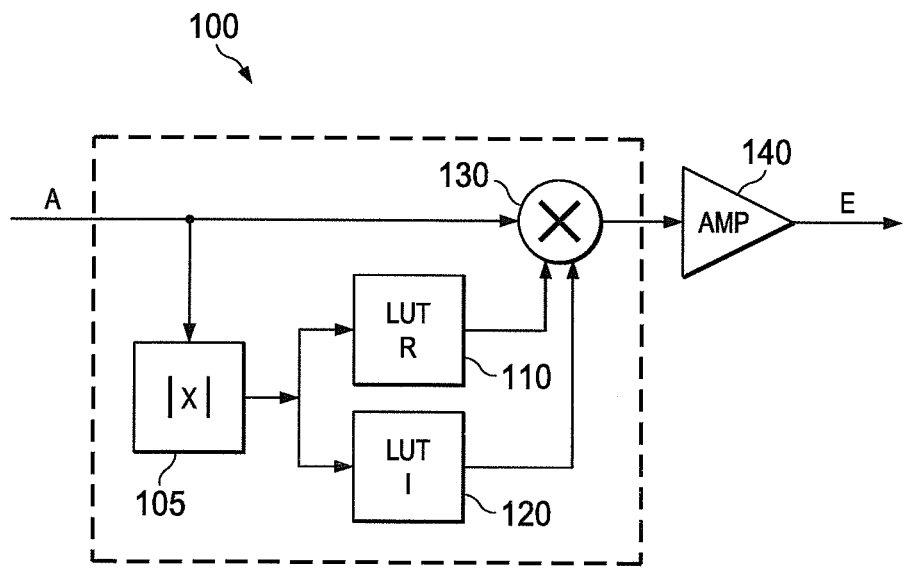
FIG. 1 illustrates power amplification circuitry that implements digital predistortion (DPD) according to one embodiment of the disclosure.

FIG. 1 illustrates power amplification circuitry 100 that implements digital predistortion (DPD) according to one embodiment of the disclosure. Power amplification circuitry 100 comprises absolute value block 105, real look-up table (LUTR) 110, imaginary look-up table (LUTI) 120, complex multiplier 130, and power amplifier 140. Power amplification circuitry 100 is a memoryless Cartesian architecture. The Cartesian memoryless block (MLB) part of a digital predistortion (DPD) architecture comprises two look-up tables that are indexed by the magnitude of the input signal. The outputs of the two look-up tables represent a complex gain signal (i.e., real and imaginary parts) that, in turn, is multiplied by the complex input signal to get a final complex digital pre-distorter output signal.

The complex signal A is one input to complex multiplier 130. The complex signal A is also the input to absolute value block 105, which outputs the magnitude of input signal A. The magnitude value is used to index real look-up table (LUTR) 110 and imaginary look-up table (LUTI) 120. The output of LUTR 110 is the real component of a complex signal and the output of LUTI 120 is the imaginary component of a complex signal. The real and imaginary components from LUTR 110 and LUTI 120 comprise a complex signal that is the second input to complex multiplier 130.

The output of complex multiplier 130 is the final complex digital pre-distorter output signal that is applied to the input of amplifier 140. The output of amplifier 140 is the output signal E, which has reduced distortion.

The Cartesian LUTs (i.e., LUTR 110 and LUTI 120) are computed in the following way. First, the complex signals A and E are time aligned. Second, an array complex division of A/E is performed such that:

$$A/E=(Y_r, Y_i),$$

where $Y_r$ and $Y_i$ are the real and imaginary components, respectively.

Third, using curve-fitting algorithms, two curves (real and imaginary) are computed that best fit the data with coordinates ($|A|, Y_r$) and ($|A|, Y_i$). As noted above, the mathematical operations on vectors, such as absolute value, division, addition and multiplication are vector element-wise operations.

The curve-fitting algorithms produce curves that are discretized to a common value of 512 points, since the size of each look-up table (LUT) is 512. The two curves are loaded into lookup tables LUTR 110 and LUTI 120 (real and imaginary). Polynomial or spline fitting may be used for curve-fitting computation.

According to a first algorithm, the LUTs of the Cartesian memoryless digital pre-distorter may be updated iteratively in the following manner:

At iteration n:

Step 1: Time align the complex signals A and E.
Step 2: Perform complex division $A/E=(Y_r, Y_i)$.
Step 3: Compute the LUTR and LUTI as described above for curve fitting.
Step 4: LUTR(n)=p*LUTR(n−1)+(1−p)*(LUTR(n−1)*LUTR−LUTI(n−1)*LUTI),
Step 5: LUTI(n)=p*LUTI(n−1)+(1−p)*(LUTR(n−1)*LUTRI+LUTI(n−1)*LUTR),
Step 6: Go back to Step 1 for iteration n+1.

The parameter p is used to control the speed of convergence and stability. By way of example, 0.5<p<0.8.

Figure 2:
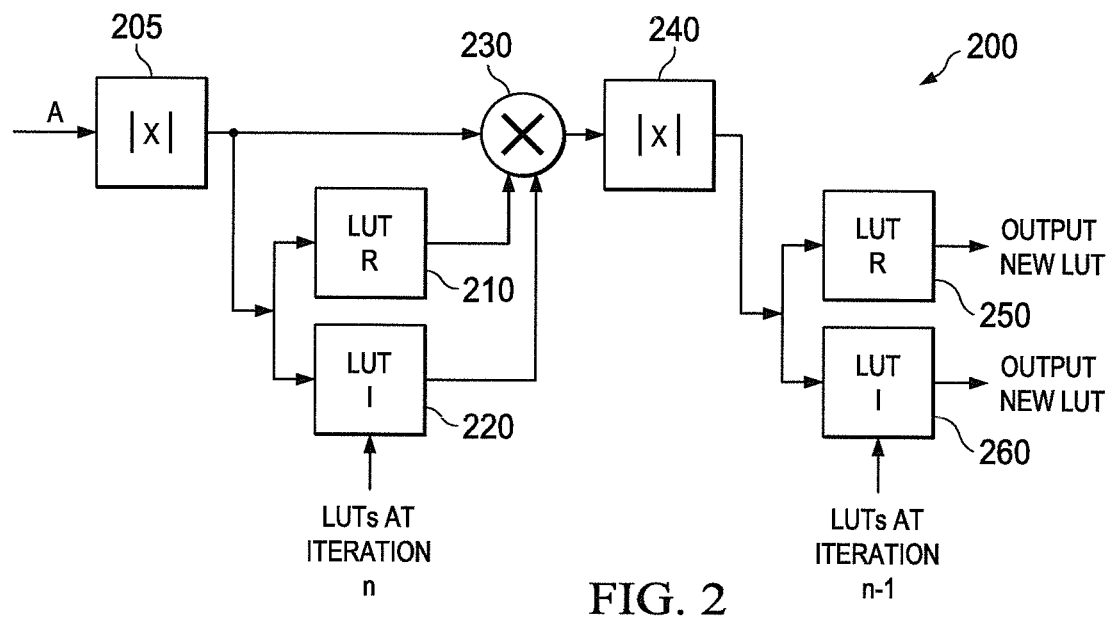
FIG. 2 illustrates power amplification circuitry that implements digital predistortion (DPD) according to another embodiment of the disclosure.

According to a second algorithm, the LUTs of the Cartesian memoryless digital pre-distorter may be updated iteratively as shown in FIG. 2. FIG. 2 illustrates circuitry 200 for implementing an algorithm that combines the latest LUTs with previous LUTs for a memoryless Cartesian DPD according to one embodiment of the disclosure. Circuitry 200 comprises absolute value block 205, real look-up table (LUTR) 210, imaginary look-up table (LUTI) 220, complex multiplier 230, absolute value block 240, real look-up table (LUTR) 250, and imaginary look-up table (LUTI) 260.

Real look-up table (LUTR) 210 and imaginary look-up table (LUTI) 220 contain the real and imaginary values in real look-up table (LUTR) 110 and imaginary look-up table (LUTI) 120 (from FIG. 1) at iteration n. Real look-up table (LUTR) 250 and imaginary look-up table (LUTI) 260 contain the real and imaginary values in real look-up table (LUTR) 110 and imaginary look-up table (LUTI) 120 (from FIG. 1) at iteration n−1. The outputs of real look-up table (LUTR) 250 and imaginary look-up table (LUTI) 260 are then loaded into real look-up table (LUTR) 110 and imaginary look-up table (LUTI) 120 from FIG. 1 for the next iteration.

Thus, the circuitry in FIG. 2 may be used to update iteratively the LUTs in the following manner. At iteration n:

Step 1: Time align the complex signals A and E.
Step 2: Perform the complex division $A/E=(Y_r, Y_i)$.
Step 3: Compute the LUTR and LUTI as described above for curve fitting.
Step 4: Using the LUTR and LUTI computed at iteration n and n−1, compute the output as shown in FIG. 2.
Step 5: Go back to Step 1 for iteration n+1.

In FIG. 2, the signal A is again a scan from 0 to the maximum acceptable dynamic range discretized to 512 points. Therefore, the output will also be 512 points, which represents the new real LUT and the new imaginary LUT, thereby combining the LUTs of iterations n and n−1.

Memory Part of the Digital Pre-Distorter

For the memory compensation part of the digital pre-distorter (DPD), an iterative algorithm is disclosed that improves the performance of the DPD with each iteration, until linearization of the amplifier satisfies the requirements. The disclosed algorithm may be applied to direct or indirect learning architectures, as well as to different well-known DPD models that may comprise one or more linear or nonlinear blocks such as: 1) a DPD model that comprises one non-linear filter (NF) block (see FIG. 3); a DPD model that comprises one memoryless block (MLB) followed by an NF block (i.e., Hammerstein model, see FIG. 4); and 3) a DPD model that comprises one MLB between two NFBs (i.e., Hammerstein-Wiener model, see FIG. 5). It is noted that the NF blocks may be replaced with a linear filter blocks and the algorithms will still apply.

Figure 3:
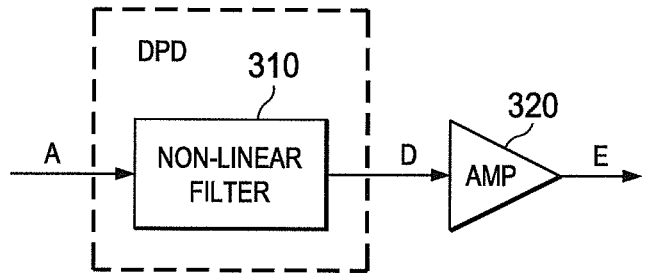
FIG. 3 illustrates a digital predistortion (DPD) architecture comprising single non-linear filter block (NFB) according to a well-known embodiment.

FIG. 3 illustrates a digital predistortion (DPD) architecture comprising a single non-linear filter block (NFB) according to one well-known embodiment. The DPD architecture comprises nonlinear filter block (NFB) 310, which applies pre-distortion to input signal A to create pre-distorted signal D at the input to amplifier 320. The predistortion improves the linearity of the amplified output signal E generated by amplifier 320.

Figure 4:
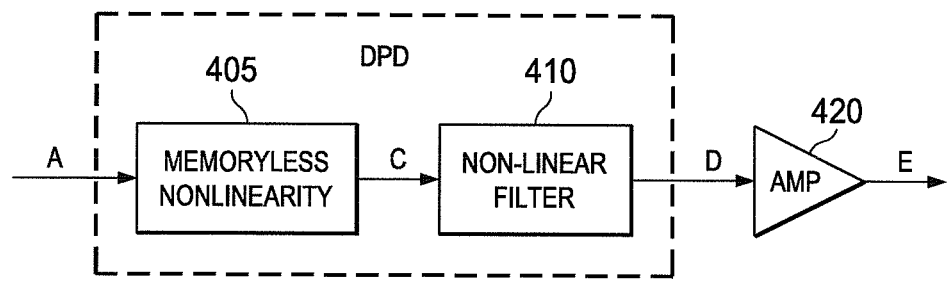
FIG. 4 illustrates a digital predistortion (DPD) architecture according to the Hammerstein model.

FIG. 4 illustrates a digital predistortion (DPD) architecture according to the Hammerstein model. The DPD architecture comprises memoryless nonlinearity block (MLB) 405 and nonlinear filter block (NFB) 410. MLB 405 may be based on, for example, look-up tables, such as those in FIG. 1. MLB 405 and NFB 410 apply predistortion to input signal A to create pre-distorted signal D at the input to amplifier 420. The predistortion improves the linearity of the amplified output signal E generated by amplifier 420.

Figure 5:
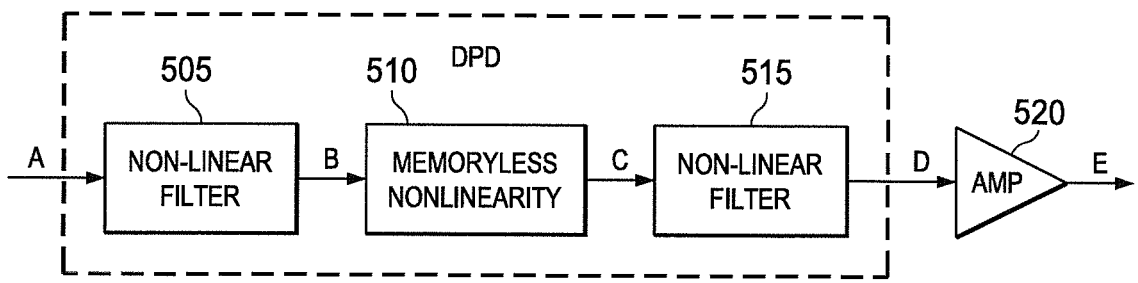
FIG. 5 illustrates a digital predistortion (DPD) architecture according to the Hammerstein-Wiener model.

FIG. 5 illustrates a digital predistortion (DPD) architecture according to the Hammerstein-Wiener model. The DPD architecture comprises nonlinear filter block (NFB) 505, MLB 510 and NFB 515. NFB 505, MLB 510, and NFB 515 apply predistortion to input signal A to create pre-distorted signal D at the input to amplifier 520. The predistortion improves the linearity of the amplified output signal E generated by amplifier 520.

The iterative algorithm disclosed below operates on one DPD block (i.e., MLB or NFB) at time and comprises the following steps. At iteration n:

Step 1: Compute the parameters of the residual error model (REM).
Step 2: Compute the parameters of the inverse of REM (IREM). This step is needed only for a direct learning architecture.
Step 3: For an indirect learning architecture, combine the REM computed at iteration (n) with the NFB part of the DPD architecture computed at iteration (n−1) to produce a new NFB DPD model.

For the direct learning architecture, combine the IREM computed at iteration (n) with the NFB part of the DPD computed at iteration (n−1) to produce a new NFB DPD model.

Step 4: Replace the old NFB with the new NFB.

Step 5: Go to Step 1.

Technically, the filter in the Hammerstein and Hammerstein-Wiener models are linear by definition. However, the term "extended" Hammerstein model is usually used when a linear filter is replaced by a nonlinear filter. Nevertheless, the present disclosure will drop the term "extended". Next, the present disclosure will discuss applying the algorithm above for three different DPD models.

Figure 6:
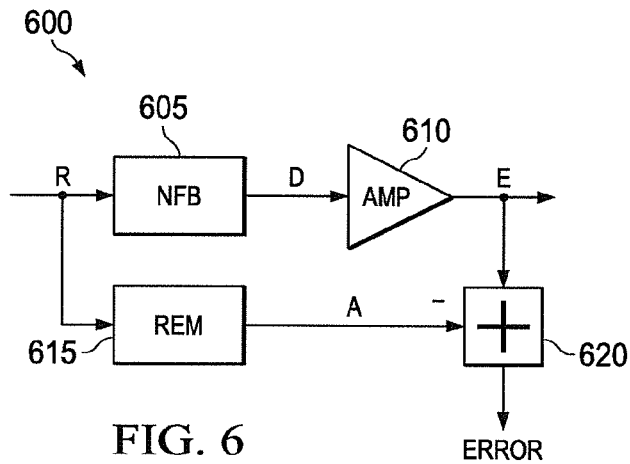
FIG. 6 illustrates power amplification circuitry that implements digital predistortion (DPD) using the direct learning method with one non-linear filter block.

Case 1: DPD Including with One NFB Only:

Direct Learning Approach:

In the direct modeling approach, the REM is first computed as shown in FIG. 6. FIG. 6 illustrates power amplification circuitry 600, which implements digital predistortion (DPD) using the direct learning method with one non-linear filter block (NFB). Power amplification circuitry 600 comprises NFB 605, amplifier 610, residual error modeling (REM) block 615, and adder 620. The input R is applied to the inputs of NFB 605 and REM block 615. The filtered output, D, of NFB 605 is the input to amplifier 610. The amplified output, E, of amplifier 610 is one input to adder 620. The output of REM block 615 is the other input to adder 620. The output of adder 620 is the error signal.

REM block 615 models the combination of NFB 605 and amplifier 610 to produce the same signal E. If this is done correctly, both inputs of adder 620 are the same and the error signal is zero. The direct learning method attempts to find the parameters of REM block 615 that minimize the error signal from adder 620.

In the direct modeling approach, the REM is computed as shown in FIG. 6 using one of the least square methods. REM 615 has the same mathematical structure as NFB 605. Using a least square method, the parameters of the REM may be determined in such way that these parameters may be used together with the input signal, R, to REM 615 to obtain the best estimate of the target signal E. This is usually done by minimizing the norm error vector, $\|e\|^2 = \|R-A\|^2$, where A is the output of REM 615. Iterative methods such as LMS and RLS can also be used to compute these parameters using one of the least square methods. The REM 615 that is calculated is the best model that represents the combination of NFB 605 computed at iteration (n−1) combined with amplifier 610.

Figure 7:
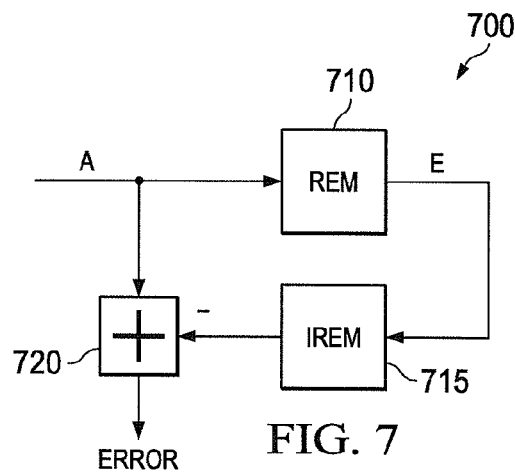
FIG. 7 illustrates circuitry for determining the inverse residual error model according to a first method.
Figure 8:
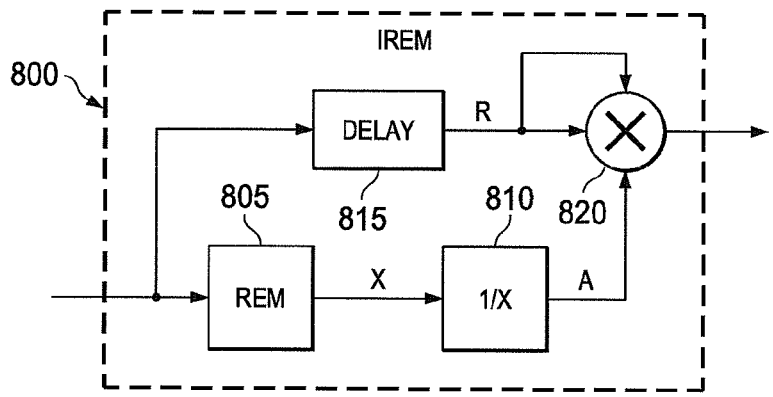
FIG. 8 illustrates IREM block for determining the inverse residual error model according to the second method.

The next step is to compute the inverse of REM 615 in order to merge it with NFB 605 computed in a previous iteration. Two methods may be used to find the inverse residual model: 1) compute the parameters of the inverse of REM (IREM) as shown in FIG. 7 using a least square method where the input signal is E and the target signal is A; and 2) build the inverse model IREM directly from the REM model as shown in FIG. 8. This is only possible when signals A and R are aligned. The advantage of this approach is that there is no need to compute any parameters.

FIG. 7 illustrates circuitry 700 for determining the inverse residual error model according to a first method. Circuitry 700 comprises residual error model (REM) block 710, inverse residual error model (IREM) block 715, and adder 720. The input signal, A, is filtered by REM block 710 to produce the output signal, E. The output signal E is then applied to the input of IREM block 715. The input signal A is one input of adder 720. The other input of adder 720 is the output of IREM block 715. Circuitry 700 computes the coefficients of the inverse of REM (IREM) using a least square method, where the input signal is E and the output is the target signal A. The difference between the input signal A and the target signal at the output of IREM 715 is the error signal. This error signal is minimized by a least square method in order to compute the parameters of IREM 715.

FIG. 8 illustrates a structure for IREM block 800 for determining the inverse residual error model according to the second method. IREM block 800 comprises residual error model (REM) block 805, inverter 810, delay circuit 815, and complex multiplier 820. The inverse model IREM is built directly from the REM model. This is only possible when signals A and R are aligned. Alignment is provided by delay circuit 815. The advantage of this second method is that there is no need to compute the coefficients, thereby saving a least square computation.

Figure 9:
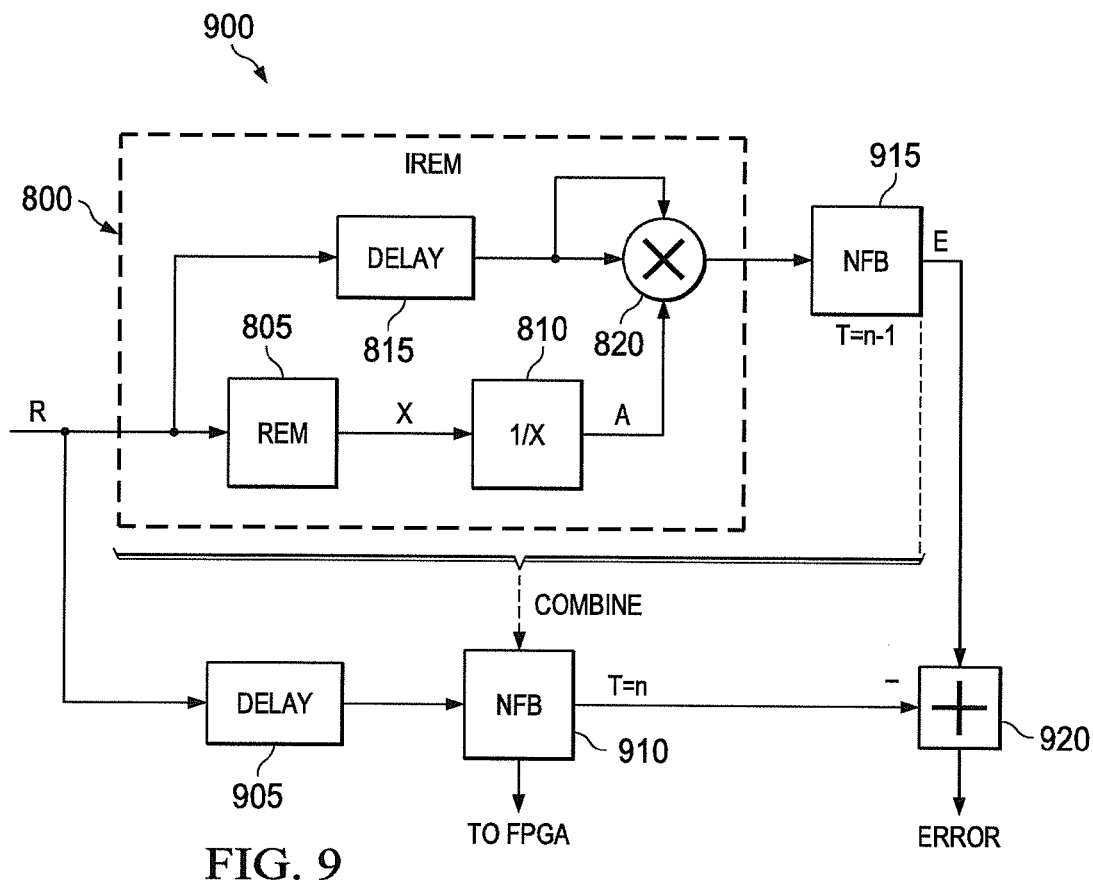
FIG. 9 illustrates a circuit, which combines the IREM block of FIG. 8 with a non-linear filter block (NFB) to produce a new NFB according to a direct learning configuration.

The next step is to compute the parameters of the new NFB model that is mathematically equivalent to the model of IREM computed at iteration (n) with the NFB computed at iteration (n−1) combined together, as shown in FIG. 9. FIG. 9 illustrates circuit 900, which combines IREM block 800 with non-linear filter block (NFB) 915 to produce new non-linear filter block (NFB) 910 according to a direct learning configuration of the present disclosure. Circuit 900 comprises IREM block 800, delay circuit 905, non-linear filter block (NFB) 910, non-linear filter block (NFB) 915, and adder 920.

The new NFB model replaces the previously computed NFB model at iteration (n−1). The new NFB has the same mathematical structure as the REM or the NFB. As mentioned before, a least square method may be used to compute the new NFB parameters, where the input signal is R and the target signal is E, as shown in FIG. 9. The next step is to replace the old NFB with the new NFB. This process may continue iteratively until the linearization requirements are met.

Figure 10:
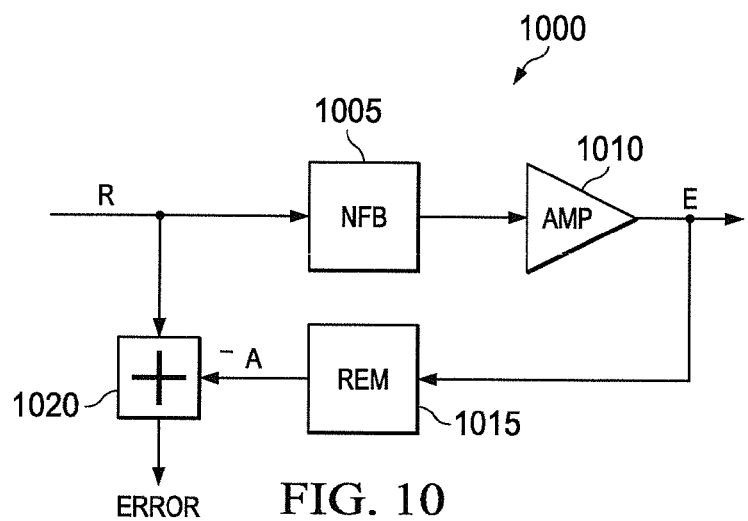
FIG. 10 illustrates power amplification circuitry that implements digital predistortion (DPD) using the indirect learning method with one non-linear filter block (NFB)

Indirect Learning Approach:

The indirect modeling approach first computes the REM as shown in FIG. 10. FIG. 10 illustrates power amplification circuitry 1000, which implements digital predistortion (DPD) using the indirect learning method with one non-linear filter block (NFB) 1005. Power amplification circuitry 1000 comprises non-linear filter block (NFB) 1005, amplifier 1010, residual error model (REM) block 1015, and adder 1020.

REM block 1015 has the same structure as NFB 1005. A least square (LS) approach may be used to find the parameters of REM block 1015 such that if the parameters are used together with the input signal to REM block 1015 (i.e., amplifier 1010 output E), then a best estimate of target signal R is obtained such that the norm error vector $\|e\|^2 = \|R-A\|^2$ is minimized. Iterative methods such as LMS and RLS may also be used to compute these parameters using one of the least square methods. The REM 1015 found is the best inverse model that represents the combination of the NFB 1005 computed at iteration (n−1) combined with amplifier 1010.

Figure 11:
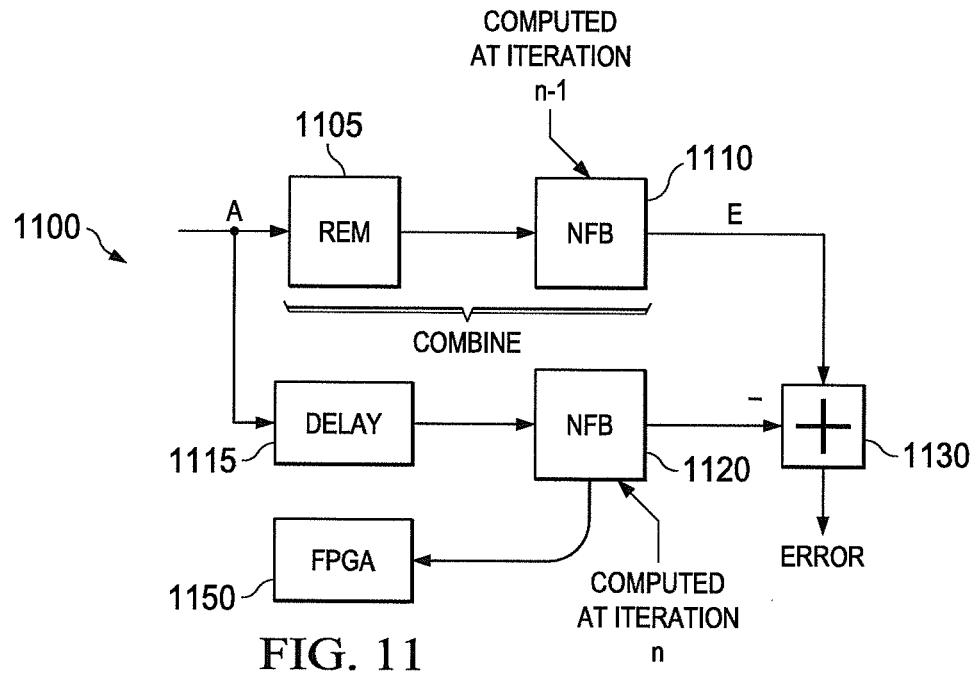
FIG. 11 illustrates a circuit that combines the REM block of FIG. 10 with a non-linear filter block (NFB) to produce a new NFB according to an indirect learning configuration.

The next step is to compute the parameters of the new NFB model that is mathematically equivalent to the model of REM 1015 computed at iteration (n) combined with the NFB computed at iteration (n−1), as shown in FIG. 11. FIG. 11 illustrates circuitry 1100 that combines the REM block of FIG. 10 with a non-linear filter block (NFB) 1110 to produce a new non-linear filter block (NFB) 1120 according to an indirect learning configuration of the present disclosure. Circuitry 1100 comprises REM block 1105, non-linear filter block (NFB) 1110, delay element 1115, NFB 1120, adder 1130, and field programmable gate array (FPGA) 1150.

The new NFB model replaces the previously computed NFB model at iteration (n−1). The new NFB has the same mathematical structure as REM or the old NFB. As mentioned before, a least square method may be used to compute the new NFB parameters where the input signal is A and the target signal is E. The next step is to replace the old NFB with the new NFB. This process may continue iteratively until the linearization requirements are met.

These steps may be summarized as follows. At iteration n:

Step 1: Compute the REM using the direct or indirect learning approach. For direct approach compute also IREM.

Step 2: Combine REM for indirect learning approach or IREM for direct approach with NFB computed at iteration (n−1) to get the new NFB.

Step 3: Update the old NFB in the FPGA with the new one.

Step 4: Go back to step one.

Figure 12:
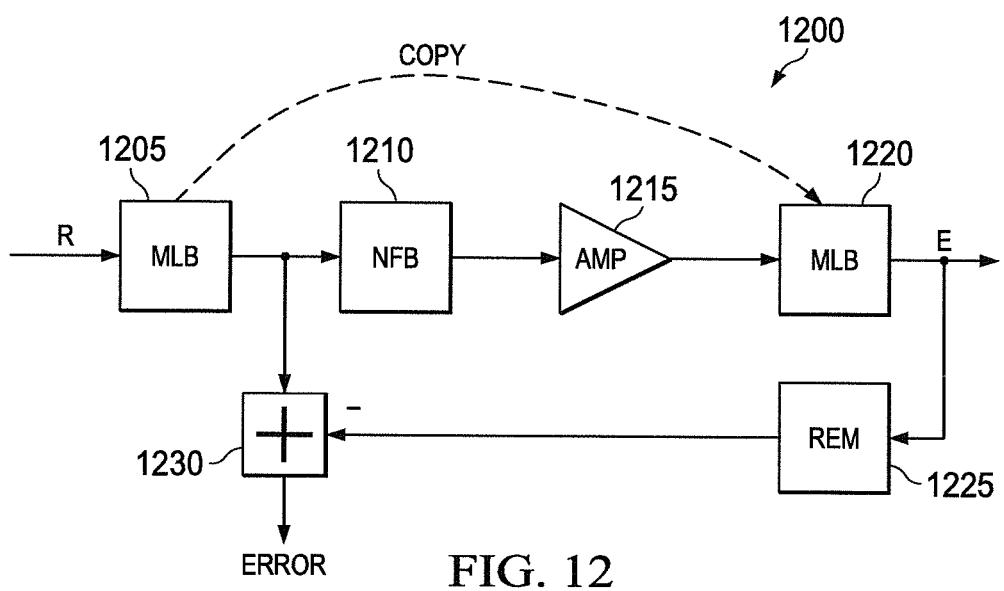
FIG. 12 illustrates a Hammerstein indirect learning implementation of REM computation.
Figure 13:
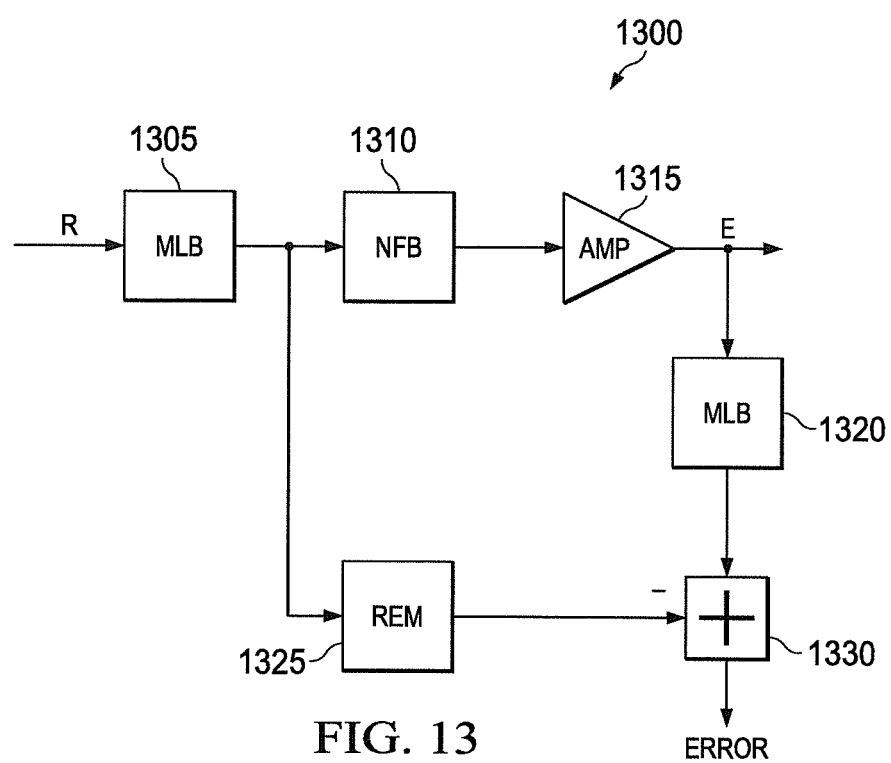
FIG. 13 illustrates a Hammerstein direct learning implementation of REM.

Case 2: DPD According to Hammerstein Model:

The first step in the Hammerstein DPD model is to compute the MLB model. To compute the NFB, the same steps as mentioned in Case 1 above for direct and indirect learning are followed. FIG. 12 illustrates a Hammerstein indirect learning implementation of REM computation. FIG. 13 illustrates a Hammerstein direct learning implementation of REM.

In FIG. 12, memoryless block (MLB) 1205, non-linear filter block 1210 and power amplifier 1215 form a Hammerstein model. The output of amplifier 1215 is coupled to memoryless block (MLB) 1220 to generate the output signal, E. REM block 1225 filters the output signal E to generate one input to adder 1230. The other input to adder 1230 is the output of MLB 1205. The parameters of REM block 1225 are determined in order to minimize the Error signal at the output of adder 1230.

In FIG. 13, memoryless block (MLB) 1305, non-linear filter block 1310 and power amplifier 1315 form a Hammerstein model. The output of amplifier 1315 is the output signal, E. Memoryless block (MLB) 1320 filters the output signal E to generate one input to adder 1330. REM block 1325 filters the output of MLB 1305 to generate the other input to adder 1330. The parameters of REM block 1325 are determined in order to minimize the Error signal at the output of adder 1330.

In the indirect configuration (FIG. 12), the computed REM model is combined with the NFB filter as in Case 1 above. For the direct configuration (FIG. 13), the REM and the IREM models are computed as in Case 1 above, then the IREM is combined with the NFB to form a new NFB that replaces the old NF of the previous iteration. This procedure can continue iteratively until the linearization requirements are met.

These steps may be summarized as follows. At iteration n:

Step 1: Compute the MLB.

Step 2: Update MLB.

Step 3: Compute the REM using the direct or indirect approach. For direct the approach, also compute the IREM.

Step 4: Combine the REM for indirect approach or IREM for direct approach with NFB computed at iteration (n−1) to get the new NFB.

Step 5: Update the old NFB in the FPGA with the new one.

Step 6: Go back to step one.

Figure 14:
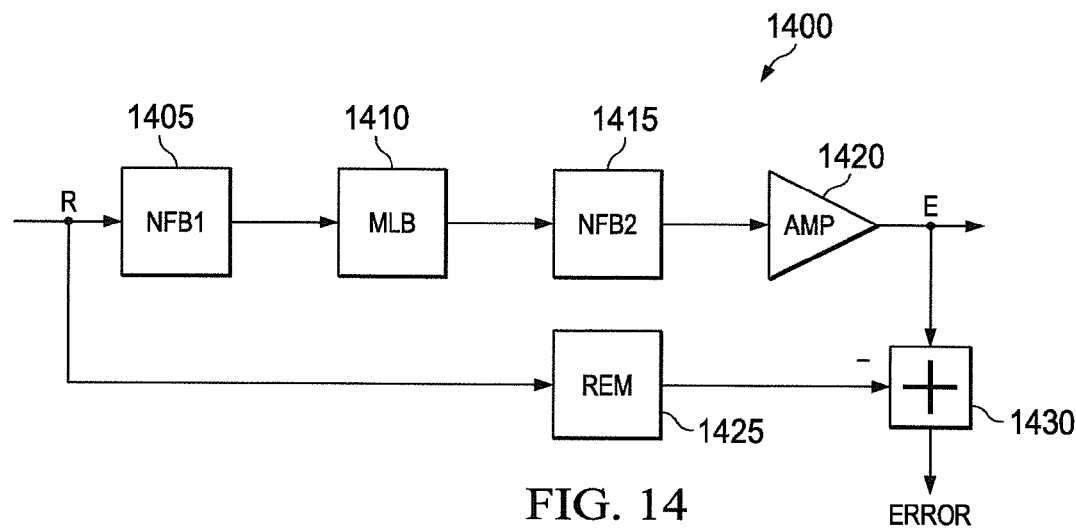
FIG. 14 illustrates a Hammerstein-Weiner direct learning implementation of REM computation.
Figure 15:
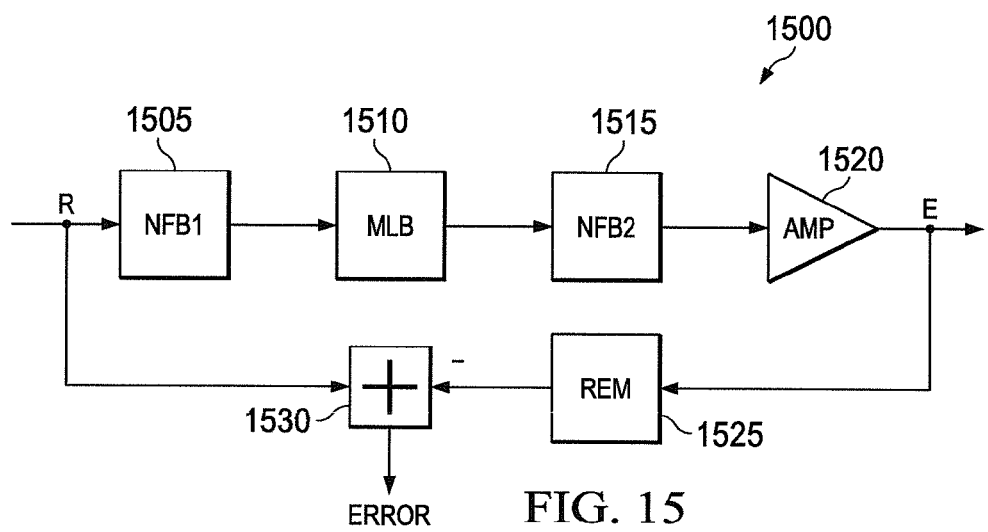
FIG. 15 illustrates a Hammerstein indirect learning implementation of REM computation.

Case 3: DPD According to Hammerstein-Wiener Model:

The first step is to compute the MLB and the NFB2 the same way as computed in the Hammerstein model described above. Then, the NFB1 may be computed using the direct or indirect configurations. FIG. 14 illustrates a Hammerstein-Weiner direct learning implementation of REM computation. FIG. 15 illustrates a Hammerstein indirect learning implementation of REM computation.

In FIG. 14, first non-linear filter block (NFB1) 1405, memoryless block (MLB) 1410, second non-linear filter block (NFB2) 1415, and power amplifier 1420 form a Hammerstein-Weiner model. The output of amplifier 1420 is the output signal, E. Residual error model (REM) block 1425 filters the input signal R to generate one input to adder 1430. The other input to adder 1430 is the output signal, E, from power amplifier 1420. The parameters of REM block 1545 are determined in order to minimize the Error signal at the output of adder 1430.

In FIG. 15, first non-linear filter block (NFB1) 1505, memoryless block (MLB) 1510, second non-linear filter block (NFB2) 1515, and power amplifier 1520 form a Hammerstein-Weiner model. The output of amplifier 1520 is the output signal E. Residual error model (REM) block 1525 filters the output signal E to generate one input to adder 1530. The other input to adder 1530 is the input signal R. The parameters of REM block 1525 are determined in order to minimize the Error signal at the output of adder 1530.

As discussed before the REM is computed first. In the case of direct learning configuration (FIG. 14), the REMI is computed then combined with the previous NFB1 to produce the new NFB1 as explained above. Finally, the new NFB1 replace the old NFB1 in the FPGA. After all block are computed this procedure can continue iteratively until the linearization requirements are met.

These steps may be summarized as follows. At iteration n:

Step 1: Compute the MLB and NFB2 as explained in the Hammerstein model.

Step 2: Compute the REM using the direct or indirect approach. For direct approach/compute also IREM.

Step 3: Combine REM for indirect approach or IREM for direct approach with NFB1 computed at iteration (n−1) to get the new NFB.

Step 4: Update the old NFB1 in the FPGA with the new one.

Step 5: Go back to step one.

The disclosed embodiments provide numerous advantages over the related art. One advantage is that direct learning approach is used to produce a solution for the digital pre-distorter. The direct method is superior in certain ways to the indirect method, such as producing better ACLR. In addition, the present disclosure implements modeling the residual error, a feature that may also benefit the indirect approach by producing a better solution than the indirect learning method.

Another advantage is related to the Cartesian memoryless digital pre-distorter. The disclosure offers a method to compute the look-up tables (LUTs). Two algorithms are disclosed to update the LUTs iteratively.

The present disclosure discloses a method to compute the memoryless Cartesian part of a digital pre-distorter and update its parameters iteratively until convergence using two different algorithms. The present disclosure discloses a method to compute the memory part of a digital pre-distorter iteratively using the residual memory modeling (REM) approach and updating the digital pre-distorter iteratively by combining the REM for the indirect learning approach—or the inverse REM (IREM) for the direct learning approach—with the previous NFB solution and for different digital pre-distorter models. The present disclosure also discloses a method to construct the IREM block using the REM block efficiently and accurately without the need to compute its coefficients with the least square method.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a transmitting device comprising a non-linear amplifier, a digital predistortion (DPD) circuit including a non-linear filter (NF) block, and a residual error model (REM) block associated with the non-linear amplifier and the DPD circuit configured in a direct learning architecture, a method of updating parameters of the NF block comprising:

at iteration n, where n is an integer, computing the parameters of the REM block;

at iteration n, computing inverse parameters of the REM block;

combining the inverse parameters of the REM block computed at iteration n with the parameters of the NF block computed at iteration n−1 to produce new parameters of the NF block;

replacing the parameters of the NF block at iteration n−1 with the new parameters of the NF block, wherein the DPD circuit further comprises a memoryless linearity block preceding the non-linear filter (NF) block and a second non-linear filter block preceding the memoryless linearity block.

2. The method as set forth in claim 1, wherein the digital predistortion (DPD) circuit is based on a Hammerstein model and further comprises a memoryless linearity block preceding the non-linear filter (NF) block.

3. The method as set forth in claim 1, wherein a least square method is used to determine the parameters of the REM block.

4. The method as set forth in claim 3, wherein determining the parameters of an REM block using the least squares method comprises minimizing a norm error vector $\|e\|^2 = \|R-A\|^2$, where $\|e\|^2$ is a norm error vector, R is an input signal, and A is an output of the REM block.

5. The method as set forth in claim 3, wherein the least squares method is used to determine the parameters of the REM block via a least mean squares (LMS) method.

6. The method as set forth in claim 3, wherein the least squares method is used to determine the parameters of the REM block via a recursive least squares (RLS) method.

7. The method as set forth in claim 1, wherein the inverse REM block is built directly from the REM block.

8. The method as set forth in claim 1, wherein a least squares method is used to determine the parameters of the inverse REM block.

9. For use in a transmitting device comprising i) a non-linear amplifier, ii) a digital predistortion (DPD) circuit including a first non-linear filter (NF) block and a memoryless linearity block preceding the first non-linear filter (NF) block and a second NF block preceding the memoryless linearity block, and iii) a residual error model (REM) block associated with the non-linear amplifier and the DPD circuit and configured in a direct learning architecture, a method of updating parameters of the DPD circuit comprising:

at iteration n, computing the parameters of the memoryless linearity block and updating the memoryless linearity block;

at iteration n, where n is an integer, computing the parameters of the REM block;

at iteration n, computing the inverse parameters of the REM block;

combining the parameters of the inverse REM block computed at iteration n with the parameters of the first and the second NF blocks computed at iteration n−1 to produce new parameters of the first and the second NF blocks;

replacing the parameters of the first and the second NF blocks at iteration n−1 with the new parameters of the first and the second NF blocks.

10. The method as set forth in claim 9, wherein a least squares method is used to determine the parameters of the REM block.

11. The method as set forth in claim 10, wherein determining the parameters of the REM block using the least squares method comprises minimizing a norm error vector $\|e\|^2 = \|R-A\|^2$, where $\|e\|^2$, is a norm error vector, R is an input signal, and A is an output of the REM block.

12. The method as set forth in claim 10, wherein the least squares method is used to determine the parameters of the REM block via a least mean squares (LMS) method.

13. The method as set forth in claim 10, wherein the least squares method is used to determine the parameters of the REM block via a recursive least squares (RLS) method.

14. The method as set forth in claim 9, wherein the inverse REM block is built directly from the REM block.

15. The method as set forth in claim 9, wherein a least squares method is used to determine the parameters of the inverse REM block.

16. For use in a transmitting device comprising i) a non-linear amplifier, ii) a digital predistortion (DPD) circuit including a first non-linear filter (NF) block, a memoryless linearity block preceding the first NF block, and a second non-linear filter (NF) block preceding the memoryless linearity block, and iii) a residual error model (REM) block associated with the non-linear amplifier and the DPD circuit and configured in a direct learning architecture, a method of updating parameters of the DPD circuit comprising:

at iteration n, computing the parameters of the memoryless linearity block and updating the memoryless linearity block;

at iteration n, computing the parameters of the second NF block and updating the second NF block;

at iteration n, where n is an integer, computing the parameters of the REM block;

at iteration n, computing the inverse parameters of the REM block;

combining the parameters of the inverse REM block computed at iteration n with the parameters of the first NF block computed at iteration n−1 to produce new parameters of the first NF block;

replacing the parameters of the first and the second NF blocks at iteration n−1 with the parameters of the first and the second NF blocks.

\* \* \* \* \*